United States Patent [19]

Stuivenwold et al.

[11] Patent Number: 4,963,831
[45] Date of Patent: Oct. 16, 1990

[54] SELF ADJUSTING FREQUENCY DEMODULATING INTEGRATED CIRCUIT

[75] Inventors: Armand M. Stuivenwold; Johannes P. M. Van Lammeren; Henricus T. P. J. van Elk; Bruno P. J. M. Motté, all of Nijmegen, Netherlands

[73] Assignee: U.S. Philips Corporation, New York, N.Y.

[21] Appl. No.: 465,561

[22] Filed: Jan. 16, 1990

Related U.S. Application Data

[63] Continuation of Ser. No. 340,971, Apr. 20, 1989, abandoned.

[30] Foreign Application Priority Data

May 2, 1988 [NL] Netherlands ............... 8801143

[51] Int. Cl.$^5$ .............. H03D 3/24; H03D 3/26; H04N 9/66
[52] U.S. Cl. ................. 329/318; 329/325; 358/23; 455/214
[58] Field of Search ............. 329/50, 110, 122, 136, 329/139, 318, 325; 358/23, 25; 455/208, 214

[56] References Cited

U.S. PATENT DOCUMENTS 4,410,856 10/1983 van Zanten ............... 329/122 X

FOREIGN PATENT DOCUMENTS 2413917 10/1975 Fed. Rep. of Germany ........ 358/23

Primary Examiner—Siegfried H. Grimm
Attorney, Agent, or Firm—Edward W. Goodman

[57] ABSTRACT

Self-adjusting frequency demodulation circuit comprising a frequency demodulator (13) which is designed as an integrated circuit, the adjustment being effected with the aid of a calibration signal source (7) of one single frequency and a measuring circuit (113, 35, 101) coupled to an output (113) of the frequency demodulator (13) by controlling the output signal amplitude of the frequency demodulation circuit with a multiplier (21) which is controllable by the measuring circuit and forms part of a tuning correction circuit which optionally may further include a level shifting circuit (57). The frequency demodulation circuit is particularly suitable for use in a SECAM color television receiver, only one frequency demodulator then being required for demodulating both the two color difference signals and the identification signal.

16 Claims, 4 Drawing Sheets

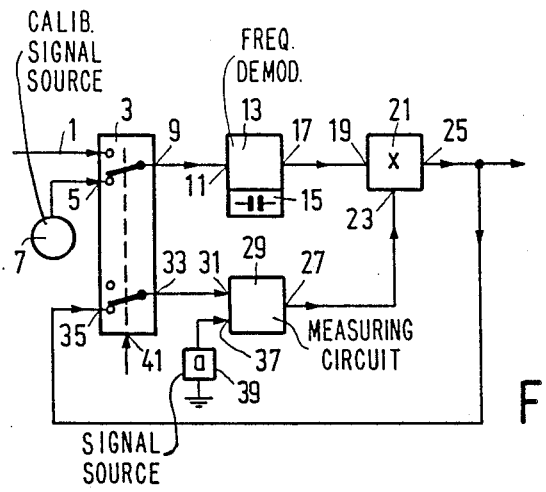
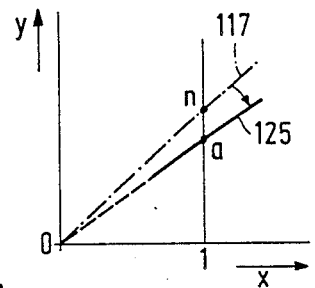
FIG.1a  FIG.1b
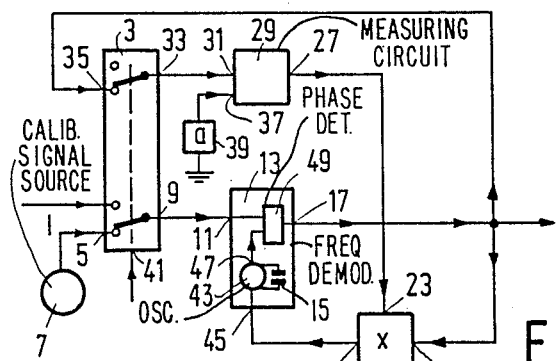
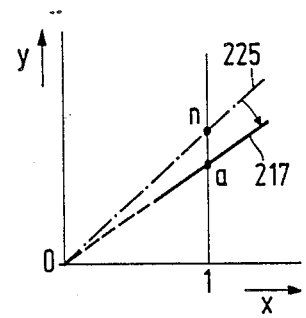
FIG.2a  FIG.2b
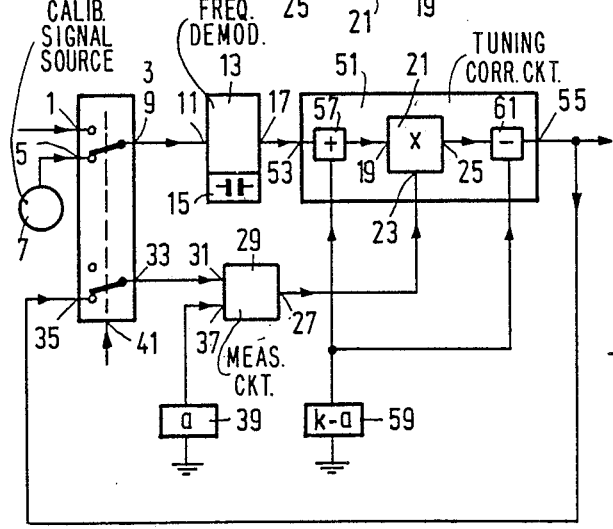
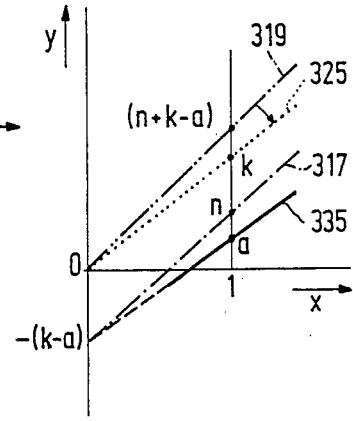
FIG.3a  FIG.3b

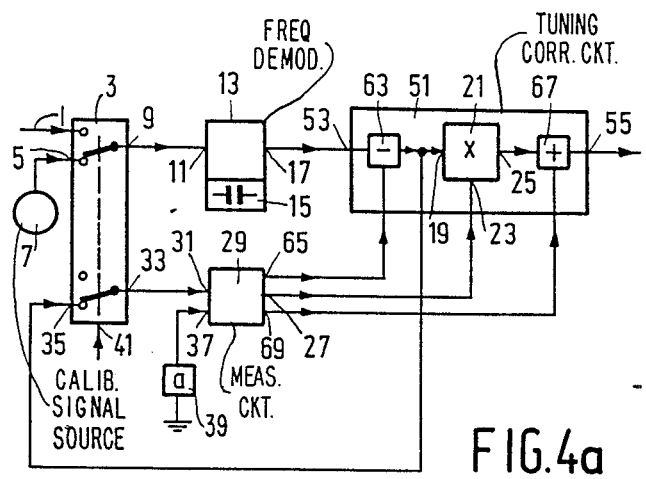
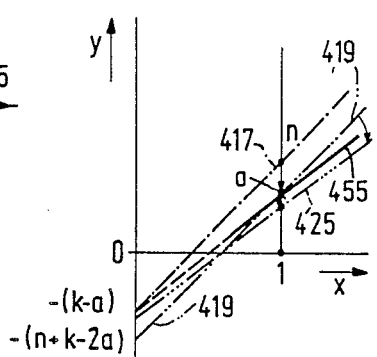
FIG. 4a
FIG. 4b
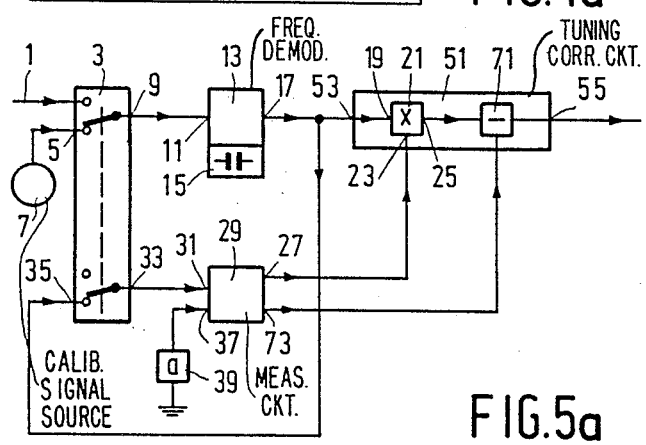
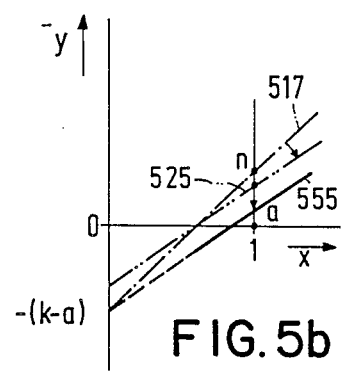
FIG. 5a
FIG. 5b
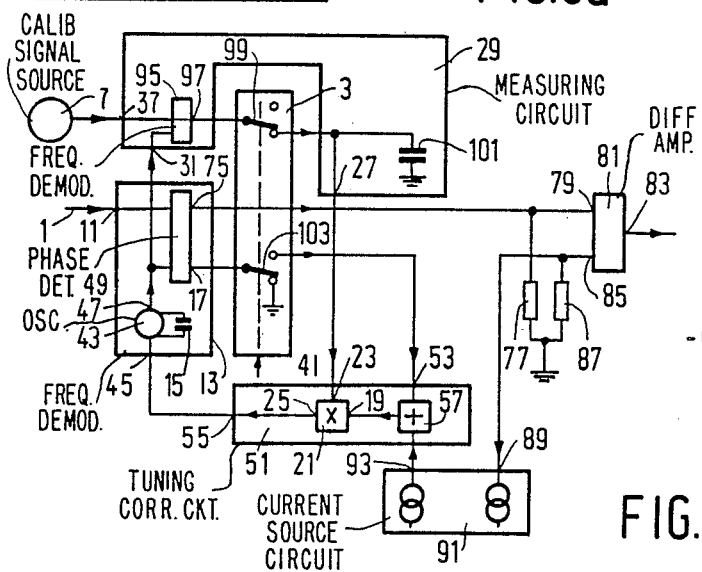
FIG. 6a
FIG. 6b

SELF ADJUSTING FREQUENCY DEMODULATING INTEGRATED CIRCUIT

This is a continuation of application Ser. No. 07/340,971, filed Apr. 20, 1989 abandoned.

BACKGROUND OF THE INVENTION

1. Field of the Invention

The invention relates to a frequency demodulation circuit comprising a frequency demodulator including, to determine the tuning of the demodulator, an inductance-free circuit having at least one capacitance element, a change-over device for switching the frequency demodulation circuit between an operating state and a calibration state in which the frequency demodulation circuit adjusts itself with the aid of a measuring circuit, a calibration signal source for producing a calibration signal, and a tuning correction circuit, an input of which is coupled to a control signal output of the measuring circuit.

2. Description of Related Art

Such a frequency demodulation circuit is disclosed in the German patent specification No. DE-C 2,413,917. Therein, the capacitance element forms part of a delay circuit arranged between two inputs of a mutiplying circuit. In a given design, the delay circuit does not include inductances and forms with the multiplying circuit the frequency demodulator. The capacitance element of the delay circuit is controllable by the measuring circuit and constitutes the tuning correction circuit which adjusts the tuning of the frequency demodulator to a value which is determined by the measuring circuit and corresponds to a calibration frequency applied by the calibration signal source in the calibration state to the frequency demodulator. The calibration frequency is then the average of the resting frequencies of the two color difference signals of a SECAM chrominance signal.

SUMMARY OF THE INVENTION

The invention has for its object to provide a tuning correction feature which is also suitable for other types of frequency demodulators and other calibration frequencies.

A frequency demodulation circuit according to the invention is therefore characterized in that the frequency demodulation circuit is predominantly an integrated circuit incorporating the capacitance element, while the capacitance element is independent of the measuring circuit, the tuning correction circuit includes a multiplier for controlling an output signal amplitude of the frequency demodulation circuit, and an input of said multiplier is coupled to the control signal output of the measuring circuit.

Consequently, the tuning correction circuit controls an output signal amplitude, that is to say the output signal value change and a given frequency swing of the input signal of the frequency demodulation circuit, by means of the multiplier.

It has been found that for frequency demodulators designed as an integrated circuit and whose tuning is consequently determined by a circuit without inductances, such as, for example, counting detectors, phase or frequency-locked loop demodulators with RC oscillators, frequency demodulators provided with an RC delay circuit or a gyrator circuit as the frequency-determining circuit, the demodulation characteristic is such that the level and the slope thereof at a predetermined calibration frequency of the input signal are coupled so that this demodulator characteristic can be corrected by means of a multiplier with the aid of a measurement at one single calibration frequency.

BRIEF DESCRIPTION OF THE DRAWINGS

The invention and its advantages will now be described in greater detail by way of example with reference to the accompanying drawing.

In the drawing:

FIGS. 1a and 1b are a block circuit diagram of a possible frequency demodulation circuit according to the invention, and the demodulation characteristic thereof;

FIGS. 2a and 2b are a block circuit diagram of a possible frequency demodulation circuit according to the invention having a phase-coupled control loop as the frequency demodulator, and the demodulation characteristic thereof;

FIGS. 3a and 3b are a block circuit diagram of a possible frequency demodulation circuit according to the invention provided with a level shifting circuit and the demodulation characteristic thereof;

FIGS. 4a and 4b are a block circuit diagram of a possible frequency demodulation circuit according to the invention provided with a level shifting circuit, controlled by a measuring circuit and the demodulation characteristic thereof;

FIGS. 5a and 5b are a block circuit diagram of a further possible frequency demodulation circuit according to the invention provided with a level shifting circuit controlled by a measuring circuit, and the demodulation characteristic thereof;

FIGS. 6a and 6b are a block circuit diagram of a possible frequency demodulation circuit according to the invention provided with a frequency demodulator designed as a phase-locked loop and the demodulation characteristic thereof;

DESCRIPTION OF THE PREFERRED EMBODIMENTS

Figure 7:
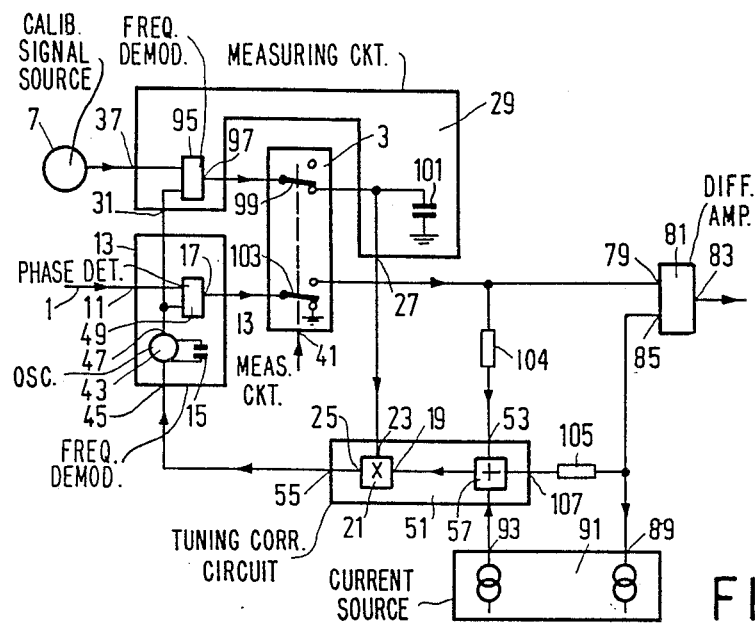
FIG. 7 is a block circuit diagram of a further possible frequency demodulation circuit according to the invention provided with a frequency demodulator designed as a phase-locked loop.

In FIG. 1a, frequency-modulated signal to be demodulated is applied to an input 1 of a frequency demodulation circuit, which also constitutes an input of a change-over device 3. A calibration signal originating from a calibration signal source 7 and having a frequency $f_c$ is applied to an input 5 of the change-over device 3. In the position not shown of the change-over device 3, which is the operating state, the frequency-modulated signal applied to the input 1 thereof is applied via its output 9 to an input 11 of a frequency demodulator 13, which in the position shown of the change-over device 3, the calibration state, receives the calibration signal.

The frequency demodulator 13 forms part of an integrated circuit and consequently does not include inductances. Its tuning is determined by a circuit which is symbolically represented by one single capacitance element 15 but which alternatively may be an RC circuit or a tuned circuit which can be assembled with the aid of a gyrator circuit in which a simulated inductance can be obtained by means of a capacitance element.

The frequency demodulator 13 may be of any integrable type, such as, for example, a counting detector, a quadrature demodulator or of a type having a phase or frequency-locked loop. The demodulation characteristic thereof is shown next to the block circuit diagram as a function of a standardized frequency x, wherein $x=1$, the calibration frequency $f_c$ is chosen as the standard frequency which need not be the frequency to which the frequency demodulator 13 has been tuned but which is indeed chosen near said frequency so as to experience the least possible influence of linearity errors.

The demodulation characteristic indicates the value y as a function of x, wherein y is an output current or voltage value. The nominal demodulation characteristic passes for $x=1$ through the point $y=a$.

In actual practice, the demodulation characteristic will result for $x=1$ in a value $y=n$ due to tolerances in the circuit 15 which determines the tuning thereof. The linear portion of the nominal demodulation characteristic, which here is represented by a fat solid line section, forms part of a line 125 with the equation $y=ax$. When the circuit is carefully designed, d.c. errors can be avoided and the actual demodulation characteristic of the frequency demodulator around the point $y=n$ is found to form part of a line 117 having the equation $y=nx$. For $x=0$, this line passes through the same point as that of the nominal characteristic $y=ax$, as was found during experiments. In this case, the origin $x=0, y=0$ is assumed for the sake of clarity, but this is not essential as will be explained hereinafter.

A signal demodulated by the frequency demodulator 13 occurring at an output 17 thereof is applied to an input 19 of a multiplier 21, to a further input 23 of which a control signal having a value a/n is applied. The characteristic $y=ax$, which is the desired nominal characteristic in the region of the calibration frequency for which $x=1$, is then obtained at an output 25 of the multiplier 21.

The control signal of the value a/n at the further input 23 of the multiplier 21 is obtained from an output 27 of a measuring circuit 29, a first input 31 of which receives from an output 33 of the change-over device 3 in the calibration state from an input 35, which is connected to the output 25 of the multiplier 21, the output signal of the multiplier 21. A second input 37 of the measuring circuit 29 receives from a signal source 39 a signal having the value a, which is a known value for a nominal demodulation characteristic in the calibration state. When the measuring circuit 29 is a differential amplifier having a high gain factor, the desired value a/n will occur at the output thereof because of a loop action. This value is stored in the measuring circuit with the aid of a memory circuit and remains available, also in the operating state, at the output 27 thereof so that at the output 25 of the multiplier 21, which here also constitutes the output of the frequency demodulation circuit, always the desired demodulation characteristic holds.

In television circuits in which the frequency demodulation circuit is incorporated, the change-over device 3 can periodically, for example in each field fly-back period, be adjusted for some time to the calibration state in response to a change-over signal applied to a switching signal input 41 thereof. Optionally, the multiplier 21 may be provided behind an amplifier, when this does not cause a level shift, or may be incorporated in the frequency demodulator.

In FIG. 2a components corresponding to those in FIG. 1a have been given the same reference numerals as in FIG. 1a.

The frequency demodulator 13 is here of a type having a phase-locked loop and includes an oscillator 43 whose tuning can be controlled with the aid of a control signal applied to an input 45 and obtained from the output 25 of the multiplier 21. The natural frequency of the oscillator 43 is determined by a circuit determining its tuning, which is again represented symbolically by the capacitance element 15. The output 17 of the frequency demodulator 13 is connected to an output of a phase detector 49, an input of which is connected to the input 11 of the frequency demodulator 13 and a further input to an output 47 of the oscillator 43.

Usually the signal at the input 45 of the frequency demodulator is used as its output signal. This signal has the demodulation characteristic 225, the useful portion of which has the value n at the calibration frequency. In this case however, the signal at the input 19 of the multiplier 21 is used as the output signal of the frequency demodulation circuit. In this case, the multiplier 21 will namely have a multiplying factor n/a because of the control loop incorporating the measuring circuit 29, so that the desired demodulation characteristic 217 occurs at its input 19.

Consequently, in the FIGS. 1a and 2a the multiplier 21 serves as a tuning correction circuit.

In FIG. 3a corresponding components have been given the same reference numerals as in the preceding Figures.

The circuit is designed such that the desired demodulation characteristic, which is denoted by 335, has a zero level which does not coincide with the zero point of the system of coordinates in which the demodulation characteristic is shown. The demodulation characteristic 317 of the frequency demodulator 13 then appears to have indeed the same point of intersection with the y-axis as the desired demodulation characteristic 335 has. The multiplier 21 can here be used as part of a tuning correction circuit 51, an input 53 of which is connected to the output 17 of the frequency demodulator 13 and an output 55 of which is connected to the input 35 of the change-over device 3. This output 55 then also constitutes the output of the frequency demodulation circuit.

The input 19 of the multiplier 21 is now connected to the input 53 of the tuning correction circuit 51 via an adder circuit 57. This adder circuit 57 further receives a signal having a value $(k-a)$ from a signal source 59. The output 25 of the multiplier 21 is connected to the output 55 of the tuning correction circuit 51 via a subtractor circuit 61. The value $(k-a)$ supplied by the signal source 59 is also applied to the subtractor circuit 61 and this value is subtracted from the output signal of the multiplier 21.

The demodulation characteristic 317 at the output 17 of the frequency demodulator 13 now forms part of a line $y=(n+k-a)-(k-a)$. At the input 19 of the multiplier 21, it becomes a portion of the line 319 with the equation $y=(n+k-a)x$. The control signal at the input 23 of the multiplier 21 turns it into the line 325 because the control loop with the measuring circuit 29 adjusts the multiplying factor to the value $k/(n+k-a)$ $$y = \frac{k}{n + k - a} \cdot (n + k - a)x = kx,$$

whereafter the substractor circuit 61 produces therefrom the line 335, $y=kx-(k-a)$, of which the desired demodulation characteristic forms part.

The values k and a are known for the desired nominal demodulation characteristic. It will be obvious that the value $x=1$ can optionally, for example, be chosen in according to $a=0$ if this is located in a useful portion of the demodulation characteristic.

In FIG. 4a corresponding components are given the same reference numerals as in the preceding Figures.

The input 31 of the measuring circuit 29 is now not connected in the calibration state to the output 55 of the tuning correction circuit 51 as in FIG. 3a, but to the input 19 of the multiplier 21 which now is connected to the input 53 of the tuning correction circuit 51 via a subtractor circuit 63. The desired demodulation characteristic is here denoted by 455 and again forms part of the line $y=kx-(k-a)$ while the demodulation characteristic at the output 17 of the frequency demodulator 13 forms part of the line denoted by 417 and having the equation $y=(n+k-a)x-)k-a)$.

Under the action of the control loop with the measuring circuit 29, the subtractor circuit 63 shifts this line 417 to the line 419 which in the calibration state yields the point $x=1$, $y=a$. Consequently, the subtractor circuit 63 then receives a control signal having the value $(n-a)$ from an output 65 of the measuring circuit 29. The equation of the line 419 will then become $$y=(n+k-a)x-(n+k-2a).$$

The multiplier 21 will correct the slope of this line by a factor $k/(n+k-a)$ causing a rotation around the point of intersection with the x-axis, which yields the line 425 with the equation $$y = kx - \frac{k(n + k - 2a)}{n + k - a}.$$

An adder circuit 67 arranged between the output 25 of the multiplier 21 and the output 55 of the tuning correction circuit 51 adds thereto a value $$\frac{a(n - a)}{n + k - a)}$$

which is received from an output 69 of the measuring circuit 29. This causes the line 425 to shift to the line 455 of which the desired nominal demodulation characteristic forms part. The values k and a are known and the value $n-a$ is generated during the control by the measuring circuit 29 so that in a simple way the above-mentioned correction value $$\frac{k}{n + k - a} \text{ and } \frac{a(n - a)}{n + k - a}$$

can be calculated by the measuring circuit 29.

It will be obvious that in the circuit of FIG. 3a, the input 35 of the change-over device 3 can optionally be connected to the output of the adder circuit 57, it then being necessary for the measuring circuit to calculate the value $k/(n+k-a)$ to be supplied from its output 27 from the value $(n+k-a)$ at its input 31, the value a at its input 37 and the known value k.

In the cases illustrated in FIG. 3a and FIG. 4a, the tuning correction circuit 51 consequently includes, in addition to the multiplier 21 a level shifting circuit having the adder circuit 57 and the subtractor circuit 61 or having the subtractor circuit 63 and the adder circuit 67.

In FIG. 5a corresponding components are given the same reference numerals as in the preceding Figures.

The input 35 of the change-over device 3 is now connected to the output 17 of the frequency demodulator 13, and in the tuning correction circuit 51, the input 19 of the multiplier 21 is connected to the input 53 of the tuning correction circuit 51 while the output 25 of the multiplier 21 is connected to the output 55 of the tuning correction circuit 51 via a subtractor circuit 71. The subtractor circuit 71, which operates as a level shifting circuit, then further receives a signal having the value $$\frac{(n - k)(k - a)}{n + k - a}$$

from an output 73 of the measuring circuit 29. As in the cases illustrated in FIG. 3a and FIG. 4a, the multiplier 21 receives at its input 23 a signal having the value $k/(n+k-a)$.

The demodulation characteristic at the output 17 of the frequency demodulator 13 forms part of a line 517 of the equation $y=(n+k-a)x-(k-a)$, which at the output 25 of the multiplier 21 results in line 525 having the equation $$y = kx - \frac{k}{n + k - a(k - a)},$$

as a result of which in response to the shift in the subtractor circuit 71 through $$\frac{(n - k)(k - a)}{n + k - a}$$

a line 555 is obtained of which the desired nominal demodulation characteristic at the output 55 of the tuning correction circuit 51 forms part.

It will be obvious that the positions of the subtractor circuit 71 and the multiplier 21 can be mutually interchanged. In that case, the output 73 of the measuring circuit 29 must then supply the value $$\frac{(n - k)(k - a)}{k}.$$

If $k=a$ no level correction needs of course to be applied.

It will further be clear that, as is also indicated in FIG. 3a, only the multiplier 21 need to be controlled by the measuring circuit 29 when an adder circuit adds a value $(k-a)$ before the multiplier and that value $(k-a)$ is again subtracted by a subtractor circuit after the multiplier and the measuring circuit preferably measures relative to the zero level between the adder circuit and the multiplier the value $(n+k-a)$ so as to be able to determine in a simple manner the multiplying factor $k/(n+k-a)$.

In FIG. 6a corresponding components are given the same reference numerals as in the preceding Figures. The design of FIG. 6a differs from that of FIG. 2a in the positions of the change-over device 3 and the measuring circuit 29, and in the fact that the tuning correction circuit 51 includes the level shift circuit designed as an adder circuit 57 which causes a current level shift since the oscillator 43 of the phase-locked loop is a current-controlled oscillator. At its output 17, the phase detector 49 supplies a current and further has a second current output 75 connected to a resistor 77 whose other end is connected to a zero level, and to an input 79 of a differential amplifier 81, an output 83 of which is the output of the frequency demodulation circuit and a further input 85 of which is connected to a resistor 87 whose other end is connected to the zero level, and to an output 89 of a current source circuit 91. The current source circuit 91 has a further output 93 which applies a level shift current to the adder circuit 57.

The input 37 of the measuring circuit 29 receives from the calibration signal source 7 the calibration signal having the calibration frequency $f_c$ and applies it to a frequency detector 95, a further input of which receives the output signal of the oscillator 43 from the input 31 of the measuring circuit 29 which is connected to the output 47 of the oscillator 43. Except as regards its number of outputs and its smoothing network, the frequency detector 95 is identical to the phase detector 49 of the frequency demodulator 13. An output 97 thereof is connected in the calibration state by a contact 99 of the change-over device 3 to a capacitor 101 which serves as a memory circuit and is further connected to the output 27 of the measuring circuit 29.

A further change-over contact 103 of the change-over device 3 connects, in the operating state, the output 17 of the phase detector 49 to the input 53 of the tuning correction circuit 51.

The demodulation characteristic at the output 55 of the tuning correction circuit 51 is now located on the line 655, the characteristic at the input 19 of the multiplier 21 is located on the line 619 and the characteristic at the input 53 of the tuning correction circuit 51 is located on the line 653, in which situation current values must be assumed to be located along the y-shaft.

When the currents supplied by the outputs 93 and 89, respectively, of the current source circuit 91 are of opposite signs and have the same absolute values, the zero level of the output signal of the differential amplifier 81 can be adjusted to $-z$ by giving the resistor 87 a value which is $z/(k-a)$ times the value of the resistor 77. This renders it possible to obtain, with the aid of a number of differential amplifiers 81 and a number of different resistors 87, output signals of different zero levels which correspond to different resting frequencies of the signal to be demodulated, which, for example when used in a SECAM television receiver, provides the possibility to obtain the two color difference signals and the identification signal on a correct output level by means of only one frequency demodulator.

In FIG. 7 corresponding components are given the same reference numerals as in the preceding Figures. This Figure differs from FIG. 6a in that the resistor 77 leading to the zero level of that Figure is now replaced by a resistor 104 connected to the input 53 of the tuning correction circuit 51, and the resistor 87 of FIG. 6a has been replaced by a resistor 105 connected to an input 107, of the tuning correction circuit 51, this input 107 being further connected to the adder circuit 57. This renders it possible to omit the output 75 of the phase detector 49 of FIG. 6a.

When the current supplied by the output 93 of the current source circuit 91 is one and a half time as high as that for the case illustrated in FIG. 6a, and the current consumed by the output 89 of the current source 91 is half the current in FIG. 6a, the ratio between the resistors 105 and 103 must be twice higher than the ratio in FIG. 6a to obtain the same setting of the differential amplifier 81 at the same positions of the demodulation characteristics.

Figure 8:
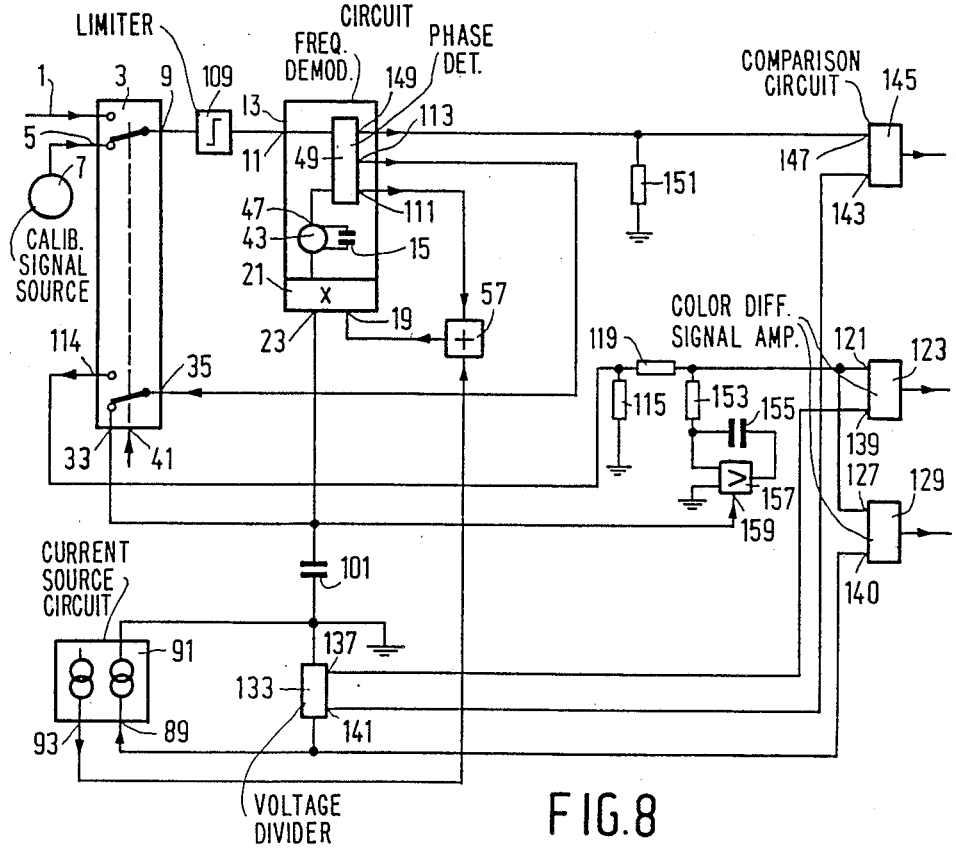
FIG. 8 is a block circuit diagram of a frequency demodulation circuit according to the invention for a SECAM color television receiver.

In FIG. 8 corresponding components are given the same reference numerals as in the preceding Figures. The input 1 receives a SECAM chrominance signal which alternately comprises in one line period a red color difference signal frequency-modulated on a 4.40625 MHz carrier and in a subsequent line period a blue color difference signal which is frequency-modulated on a 4.25 MHz carrier. During those line periods, the relevant un-modulated carrier, which is denoted the identification signal, appears briefly at the beginning of the line period.

The calibration signal source 7 produces a 4.43 MHz calibration signal which is often available in color television receivers.

A limiter 109 is arranged between the output 9 of the change-over device 3 and the input 11 of the frequency demodulator 13, so that the amplitude ratio of the signals received from the input 1 and from the calibration signal source 7 cannot play a part in the automatic tuning correction of the demodulation circuit.

The frequency demodulator 13 is of the type including a phase-locked loop which extends from the oscillator 43 to the input for the control signal of the oscillator 43 via the phase detector 49, an output 111 thereof and the tuning correction circuit 57, 21. The phase detector 49 has a second output 113 which is identical to the output 111 and is connected to the input 35 of the change-over device 3. This input 35 of the change-over device 3 is connected in the calibration state to the output 33 thereof which is connected to the capacitor 101, and in the operating state to an output 114 of the change-over device 3 which is connected to a resistor 115 whose other end is connected to the zero level of the circuit, shown in the drawing as ground, and to a resistor 119, the other end of which is connected to an input 121 of a red color difference signal amplifier 123 and to an input 127 of a blue color differnce signal amplifier 129.

The multiplier 21, serving as a frequency correction circuit, forms part of the frequency demodulator 13. The oscillator 43 is of a current-controlled type, for example of the Gilbert type. In this case the measuring circuit 29 is formed by the output 113 of the phase detector 49 and the capacitance 101, whose other end is connected to ground. The output 89 of the current source circuit 91 is connected to a voltage divider 133 whose other end is connected to the zero level of the circuit.

A tap 137 on the voltage divider 133 is connected to a further input 139 of the red color difference signal amplifier 123 and provides the black level of the red color difference signal in a manner described with reference to FIG. 6a for the differential amplifier 81. The connection of the voltage divider 133 to the output 89 of the current source circuit 91 is connected to a further input 140 of the blue color difference signal amplifier 129 and provides the black level of the blue color difference signal. A tap 141 on the voltage divider 133 applies a reference level to an input 143 of a comparison circuit 145, a signal input 147 of which is connected to a third output 149 of the phase detector 49 which output is of an identical structure as the two outputs 111 and 113 thereof and to a resistor 151 whose other end is connected to the zero level of the circuit.

The level at the input 143 of the comparison circuit 145 is chosen halfway between the levels at the inputs 139 and 140 of the color difference signal amplifiers 123 and 129 and has for its object to obtain a component of half the line frequency from the demodulated identification signal with the aid of the comparison circuit 145 and a gate circuit, not shown.

The resistors 115 and 151 have for their object to convert the output currents of the phase detector 49 into output voltages.

The connection of the resistor 119 to the inputs 121 and 127 of the color difference signal amplifiers 123 and 129 is further connected to a resistor 153 whose other end is connected to a capacitance 155 arranged between an input and an output of an amplifier 157. The amplifier 157 has a gain factor which is controllable by a control signal applied to an input 159 thereof, which, as is also the control signal providing the tuning correction, originates from the capacitance 101.

The circuit comprising the resistors 119 and 153 and capacitor 155, which constitutes a de-emphasis filter, is incoporated, as is also the circuit determining the tuning of the oscillator 43, with the capacitance 15 in the integrated circuit and consequently has the same tolerances as the capacitance 15. By the control with the aid of the control signal at the input 159 of the amplifier 157, the frequency characteristic of this de-emphasis filter is now also automatically corrected.

Figure 9:
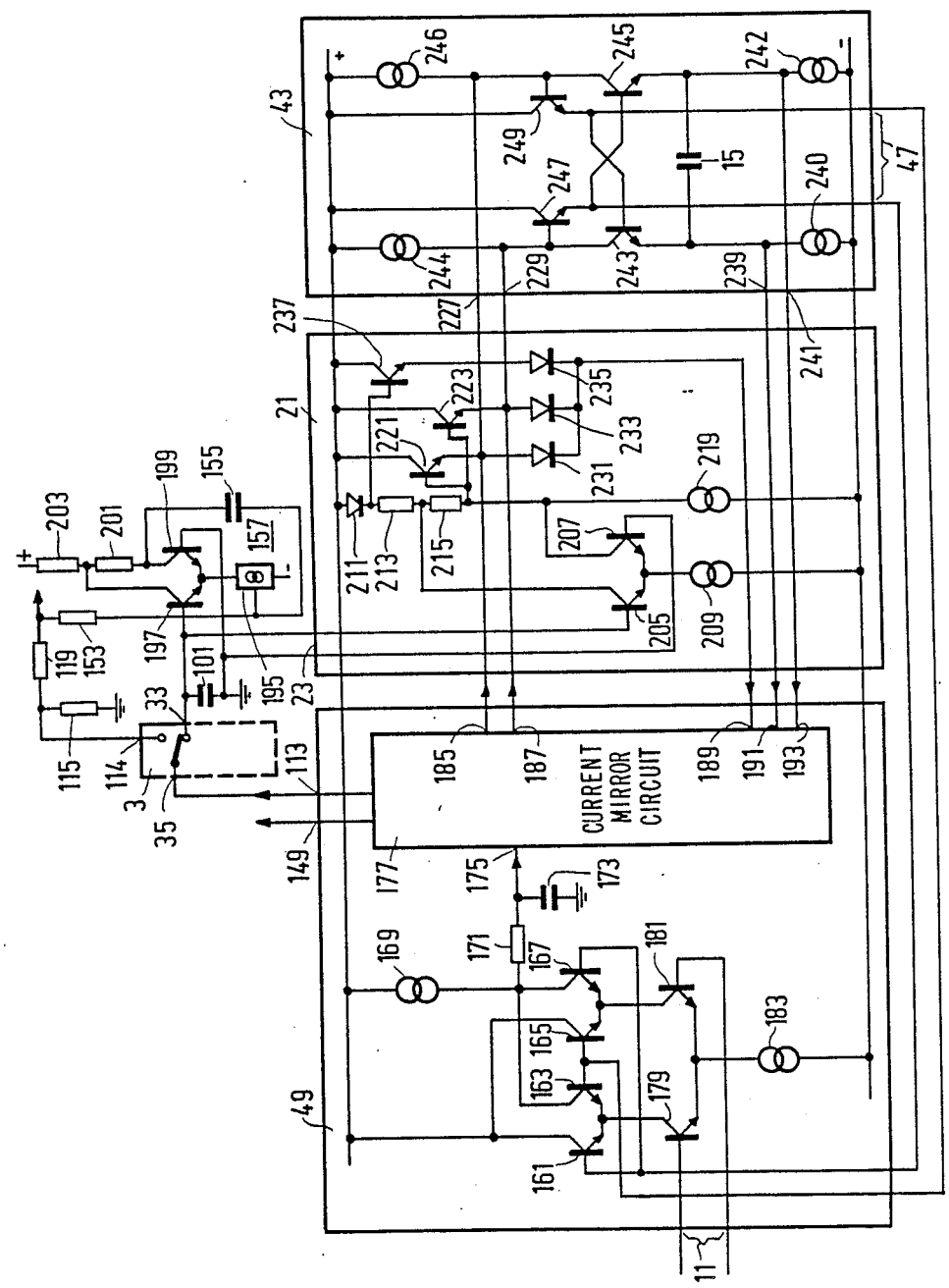
FIG. 9 is a concise basic circuit diagram of a portion of the frequency demodulation circuit of FIG. 8.

FIG. 9 shows in a concise manner a possible design of the phase detector 49, the multiplier 21, the oscillator 43 and the amplifier 157 of FIG. 8. Corresponding components are given the same reference numerals as in the preceding Figures.

The phase detector 49 includes two emitter-coupled pairs of transistors 161, 163 and 165, 167. The collectors of the transistors 161 and 165 are connected to a positive supply voltage. The collectors of the transistors 163 and 167 are connected to a current source 169 and to a resistor 171, whose other end is connected to a capacitance 173 and to an input 175 of a current mirror circuit 177. The resistor 171 and the capacitance 173 form a smoothing filter for the output signal of the phase detector. The bases of the respective transistors 161, 167 and 163, 165 receive the oscillator signal in anti-phase from the output 47 of the oscillator 43.

The through-connected emitters of the pairs of transistors 161, 163 and 165, 167, respectively, are connected to the collector of respective transistors 179 and 181, whose through-connected emitters are connected via a current source 183 to a negative supply voltage and whose bases constitute the input 11 for the chrominance signal or the calibration signal originating from the limiter 109 shown in FIG. 8.

The detecting action of this portion of the phase detector 49 is supposed to be known.

The outputs 113 and 149 of the phase detector 49 are outputs of the current mirror circuit 177 from which currents are supplied which are of the same magnitude as the current applied to the input 175. This is also the case for each of two further outputs 185 and 187 of the current mirror circuit 177, while three further outputs 189, 191, 193 thereof each consume a current which is of the same magnitude as the current applied to the input 175.

The amplifier 157 includes a current source circuit 195 which is controlled by the signal on the connection of the resistor 153 to the capacitance 155 and applies current to the interconnected emitters of two transistors 197, 199, whose bases are connected to the ends of the capacitance 101. The collector of the transistor 199 is connected to the positive supply voltage via a series arrangement of two resistors 201, 203 while the collector of the transistor 197 is connected to the connection of the resistor 201 to the resistor 203 and the collector of the transistor 199 is further connected to the capacitance 155. It may be assumed that the operation of such a controllable amplifier is sufficiently known.

The ends of the capacitance 101 are further connected via the input 23 of the multiplier 21 to the bases of an emitter-coupled pair of transistors 205, 207, whose emitters are connected to the negative supply voltage via a current source 209.

A series arrangement of a diode 211, a resistor 213, a resistor 215 and a current source 219 is further arranged between the positive and the negative supply voltages. The collector of the transistor 207 is connected to the connection between the current source 219 at the resistor 215 and the collector of the transistor 205 is connected to the connection of the resistor 215 to the resistor 213.

The transistors 205 and 207 form together with the resistors 213 and 215 a similar control circuit as the transistors 197 and 199 form with the resistors 201 and 203. The d.c. voltage occurring at the collector of the transistor 207 and controlled by the voltage across the capacitance 101 does not directly control the current supplied by the outputs 185 and 187 of the current mirror circuit 177. The desired control must namely be reciprocal with respect to the control in the amplifier 157.

The d.c. voltage which occurs at the collector of the transistor 207 and is controlled by the voltage across the capacitance 101 is connected via two emitter-followers 221, 223 to the outputs 185, 187 of the current mirror circuit which are each further connected to terminals 227, 229, respectively, of the oscillator 43 and to anodes of diodes 231, 233, respectively, the cathodes of which are connected to the cathode of a diode 235 and to the output 189 of the current mirror circuit 177. The anode of the diode 235 is connected to the emitter of an emitter-follower transistor 237 whose base is connected to the connection of the resistor 213 to the cathode of the diode 211.

Together with the diodes 231, 233, 235, the emitter-followers 221, 223, 237 form a limiter circuit as a result of which the voltages produced by the currents received from the outputs 185, 187 of the current mirror circuit 177 at the terminals 227, 229 of the oscillator 43 are limited. The upper limit is determined by the emitter-follower 237 and the lower limit by the emitter-followers 221 and 223.

The oscillator 43 is of the Gilbert type. Currents which originate from the outputs 185, 187 of the current mirror circuit 177, are applied to the terminals 227, 229. Currents of the same values are discharged from terminals 239, 241 to the outputs 191, 193 of the current mirror circuit 177. These terminals 239, 241 are connected to the ends of the capacitance 15, to respective current sources 240 and 242 and to the emitters of transistors 243 and 245, respectively. The collectors of the respective transistors 243 and 245, are connected to the respective terminals 229 and 227, to a current sources 244 and 246, respectively, and to bases of transistors 247 and 249, respectively, whose emitters are connected to bases of the respective transistors 245 and 243 and to the output 47 of the oscillator 43, and whose collectors receive the positive supply voltage.

The respective current sources 244, 246 and 240, 242 supply or discharge, respectively, mutually equal currents and perform the function of the current source which supplies the current from the output 93 of the current source circuit 91 of FIG. 8.

Of the oscillator 43, the respective transistors 243, 249 and 245, 247 are alternately conductive, the transistors 245, 247 and 243, 249, respectively, are then non-conducting. When the transistors 243 and 249 conduct, the voltage at the terminal 227 assumes the highest limit value determined by the emitter-follower 237 and the voltage at the terminal 229 assumes the lowest limit value determined by the emitter-follower 223. The voltage at the terminal 239 is then high and the voltage at the terminal 241 decreases until the transistors 245 and 247 start conducting which causes the voltage at the terminal 229 to assume the highest limit value which is again determined by the emitter-follower 237 and the voltage at the terminal 227 assumes the lowest limit value which is determined by the emitter-follower 221. The voltage at the terminal 241 is then high and the voltage at the terminal 239 decreases until the transistors 243 and 249 start conducting again. Consequently, a square wave having a duty cycle of 50% occurs at the output 47, the frequency of which is determined by the charging current of the capacitor 15 and consequently by the currents obtained from the current mirror circuit 177 and the difference between the limit values of the voltages at the terminals 227 and 229 which difference is determined by the voltage across the capacitance 101.

The current taken-up by the terminal 189 of the current mirror circuit 177 achieves a correction of the limit values, produced by the emitter-followers 221, 223 or 237, of the collector voltages of the transistors 243 and 245 which compensates a non-linearity of the demodulation characteristic of the phase-coupled loop 49, 21, 43.

The multiplier 21 explicitly shown here actually forms part, as will be apparent from the foregoing, of the oscillator 43 of the phase-locked loop frequency demodulator since the frequency of the oscillator and consequently the output current of the frequency demodulator is proportional to two quantities, the output current of the phase detector and the reciprocal value of the difference between the limit values of the collector voltages of the oscillator.

A further type of frequency demodulator at which a proportionality with two quantities occurs is the counting detector, the quantities being the amplitude of the pulses which are generated at the zero crossings of the frequency-modulated signal and are to be integrated, and the duration thereof. A multiplication by means of these quantities is then consequently reciprocal relative to that of FIG. 9, so that the synchronization with the control of the de-emphasis filter must be obtained in a different manner.

We claim:

1. A frequency demodulation circuit comprising a frequency demodulator having an inductance-free circuit, including at least one capacitance element, coupled thereto for determining the tuning of the demodulator, a change-over device for switching the frequency demodulation circuit between an operating state and a calibration state, said change-over device having a first output coupled to an input of said frequency demodulator, a first input for receiving a frequency modulated signal to be demodulated, and a second input to which an output of a calibration signal source is applied, said change-over device selectively connecting said first and second inputs to said first output, a tuning correction circuit having a input coupled to an output of said frequency demodulator, and a measuring circuit having a control signal output coupled to a control input of said tuning correction circuit, said change-over device having a second output coupled to an input of said measuring circuit, an unconnected third input and a fourth input coupled to receive a demodulated signal corresponding to said frequency modulated signal, whereby in a calibration state, said second and fourth inputs of said change-over device are connected, respectively, to said first and second outputs so that a calibrations signal from said calibration signal source is applied to said frequency demodulator and said demodulated signal is applied to said measuring circuit, thereby said frequency demodulation circuit is able to adjust itself, and in an operating state, said first and third inputs of said change-over device are connected, respectively, to said first and second outputs so that said frequency demodulator receives said frequency modulated signal and said measuring circuit is not connected to said demodulated signal, characterized in that said frequency demodulation circuit is predominantly an integrated circuit incorporating said capacitance element while the capacitance element is independent of the measuring circuit, and said tuning correction circuit includes a multiplier having a first input coupled to said input of said tuning correction circuit for controlling an output signal amplitude of the frequency demodulation circuit, and a second input coupled to said control input of said tuning correction circuit for receiving the control signal output of said measuring circuit.

2. A frequency demodulation circuit as claimed in claim 1, characterized in that the tuning correction circuit includes a level shifting circuit for shifting the level of the demodulated signal both before and after said multiplier.

3. A frequency demodulation circuit as claimed in claim 2, characterized in that the level shifting circuit is controllable by the measuring circuit.

4. A frequency demodulation circuit comprising a frequency demodulator for receiving a frequency modulated signal to be demodulated, said frequency demodulator having a controllable oscillator and an inductance-free circuit, including at least one capacitance element, coupled thereto for determining the tuning of the frequency demodulator, an output of said frequency demodulator being coupled to an output of said frequency demodulation circuit, a tuning correction circuit having an output coupled to a control input of said frequency demodulator for controlling said controllable oscillator, a measuring circuit having a control signal output coupled to a control input of said tuning correction circuit, said measuring circuit including a frequency demodulator stage coupled to receive a calibration signal from a calibration signal source and an output signal from the oscillator in said frequency demodulator for generating the control signal, and a change-over device for switching the frequency demodulation circuit between an operating state and a calibration state, said change-over device having a first stage coupled between an output of the frequency demodulator stage and the control signal output of said measuring circuit, and a second stage coupled between a further output of said frequency demodulator and an input of said tuning correction circuit, whereby in a calibration state, said first stage couples the output of said frequency demodulator stage to said control signal output, while said second stage couples the further output of said frequency demodulator to ground, and in an operating state, said first stage decouples said frequency demodulator stage from said control signal output while said second stage couples said frequency demodulator further output to said input of said tuning correction circuit, characterized in that said frequency demodulation circuit is predominantly an integrated circuit incorporating said capacitance element while the capacitance element is independent of the measuring circuit, and said tuning correction circuit includes a multiplier having a first input coupled to said input of said tuning correction circuit for controlling an output signal amplitude of the frequency demodulation circuit, and a second input coupled to said control input of said tuning correction circuit for receiving the control signal output of said measuring circuit.

5. A frequency demodulation circuit as claimed in claim 4, characterized in that the frequency demodulator is of a type having a phase-locked control loop, the multiplier being incorporated in a negative feedback portion of the control loop.

6. A frequency demodulation circuit for a SECAM color television receiver comprising a frequency demodulator having a controllable oscillator and an inductance-free circuit, including at least one capacitance element, coupled thereto for determining the tuning of the frequency demodulator, a first output of said frequency demodulator being coupled to an output of said frequency demodulation circuit, a tuning correction circuit having an input coupled to a second output of said frequency demodulator and an output coupled to a control input of said frequency demodulator for controlling said controllable oscillator, a measuring circuit having a control signal output coupled to a control input of said tuning correction circuit, and a change-over device for switching the frequency demodulation circuit between an operating state and a calibration state, said change-over device having a first stage for selectively coupling an input of said frequency demodulation circuit carrying a frequency modulated signal and a calibration signal from a calibration signal source to an input of said frequency demodulator, and a second stage for selectively coupling a third output of said frequency demodulator to an input of said measuring circuit, whereby in a calibration state, said first stage couples the calibration signal to the input of said frequency demodulator, while said second stage couples the third output of said frequency demodulator to the measuring circuit, and in an operating state, said first stage couples said frequency modulated signal to said frequency demodulator, while said second stage decouples said frequency demodulator third output from said input of said measuring circuit, wherein said frequency demodulation circuit is predominantly an integrated circuit incorporating said capacitance element while the capacitance element is independent of the measuring circuit, and said tuning correction circuit includes a multiplier having a first input coupled to said input of said tuning correction circuit for controlling an output signal amplitude of the frequency demodulation circuit, and a second input coupled to said control input of said tuning correction circuit for receiving the control signal output of said measuring circuit, characterized in that said frequency demodulation circuit further comprises two color difference signal amplifiers having first inputs coupled to said third output of said frequency demodulator by said second stage of said change-over device in the operating state, and second inputs connected to a circuit for supplying a reference level which differs from the levels of the signals applied to the first inputs of said color difference signal amplifiers.

7. A frequency demodulation circuit as claimed in claim 6, characterized in that the third output of the frequency demodulator is coupled to the first inputs of the color difference amplifiers via a filter circuit which is also incorporated in the integrated circuit, the filter circuit including an amplifier which is controllable by the measuring circuit and having a second capacitance element arranged between an input and an output thereof.

8. A frequency demodulation circuit as claimed in claim 7, characterized in that a phase-locked control loop includes said controllable oscillator which is a current-controlled oscillator of the Gilbert type and a phase detector having a first, a second and a third output, comprising said first, second and third outputs, respectively, of said frequency demodulator, said first output further being coupled to an input of a differential amplifier which is designed as a full-wave limiter and whose other input is connected to a circuit for obtaining a signal level which is the average of the levels of the signals at the other inputs of the color difference signal amplifiers whereby said differential amplifier provides a component of half the line frequency of the demodulated identification signal.

9. A frequency demodulation circuit having an operating state and a calibration state, and comprising:

A frequency demodulation including an inductance-free circuit for determining the tuning of the demodulator and having at least one capacitance element;

a measuring circuit coupled to an output of said frequency demodulator for measuring a signal which is representative of the tuning of the demodulation circuit, said measuring circuit calculating, during said calibration state, a correction factor, and having a control signal output for supplying said correction factor; and a tuning correction circuit coupled to said frequency demodulator and including a multiplier for controlling an output signal amplitude of the frequency demodulation circuit, said tuning correction circuit having an input coupled to said control signal output of said measuring circuit for receiving said correction factor.

10. A frequency demodulation circuit as claimed in claim 9, characterized in that the tuning correction circuit includes a level shifting circuit for shifting the level of the demodulated signal both before and after said multiplier.

11. A frequency demodulation circuit as claimed in claim 10, characterized in that the level shifting circuit is controllable by the measuring circuit.

12. A frequency demodulation circuit as claimed in claim 9, characterized in that the measuring circuit includes a frequency detector coupled to receive a calibration signal and an output of said frequency demodulator for generating the control signal output of said measuring circuit.

13. A frequency demodulation circuit as claimed in claim 12, characterized in that the frequency demodulator is of a type having a phase-locked control loop, the multiplier being incorporated in a negative feedback portion of the control loop.

14. A frequency demodulation circuit as claimed in claim 13, for a SECAM color television receiver, characterized in that coupled to an output of the frequency demodulator are first inputs of two color difference signal amplifiers whose second inputs are connected to a circuit for obtaining a different reference level for each of said color difference signal amplifiers.

15. A frequency demodulation circuit as claimed in claim 14, characterized in that the output of the frequency demodulator is coupled to the first inputs of the color difference amplifiers via a filter circuit which is also incorporated in the integrated circuit, the filter circuit including an amplifier which is controllable by the measuring circuit and having a second capacitance element arranged between an input and an output thereof.

16. A frequency demodulation circuit as claimed in claim 15, characterized in that the phase-locked control loop includes a current-controlled oscillator of the Gilbert type and a phase detector having a first, a second and a third output circuit, the first output circuit being coupled to a first input of the multiplier, the second output circuit being coupled to the output of the measuring circuit, and the third output circuit being coupled to an input of a differential amplifier which is designed as a full-wave limiter and whose other input is connected to a circuit for obtaining a signal level which is the average of the levels of the signals at the second inputs of the color difference signal amplifiers, whereby said differential amplifier provides a component of half the line frequency of the demodulated identification signal.

* * * * *